United States Patent
Novotny et al.

(10) Patent No.: US 8,297,069 B2
(45) Date of Patent: Oct. 30, 2012

(54) MODULAR SCALABLE COOLANT DISTRIBUTION UNIT

(75) Inventors: Shlomo D. Novotny, Wayland, MA (US); John P. Menoche, North Smithfield, RI (US); David W. Roden, Coventry, RI (US)

(73) Assignee: Vette Corporation, Portsmouth, NH (US)

( * ) Notice: Subject to any disclaimer, the term of this patent is extended or adjusted under 35 U.S.C. 154(b) by 407 days.

(21) Appl. No.: 12/727,529

(22) Filed: Mar. 19, 2010

(65) Prior Publication Data

US 2010/0236772 A1   Sep. 23, 2010

Related U.S. Application Data

(60) Provisional application No. 61/161,538, filed on Mar. 19, 2009.

(51) Int. Cl.
*F25D 23/12* (2006.01)

(52) U.S. Cl. ........................ 62/259.2; 62/434

(58) Field of Classification Search ............... 62/259.2, 62/201, 333, 203, 434; 165/80.2, 205; 361/676, 361/679.01
See application file for complete search history.

(56) References Cited

U.S. PATENT DOCUMENTS

| | | | |
|---|---|---|---|
| 4,522,253 A * | 6/1985 | Levin | 165/207 |
| 6,059,016 A * | 5/2000 | Rafalovich et al. | 165/41 |
| 6,212,895 B1 * | 4/2001 | Richardson | 62/185 |
| 6,418,748 B1 * | 7/2002 | Kramer | 62/434 |
| 6,505,557 B2 * | 1/2003 | Desaulniers et al. | 101/487 |
| 6,981,385 B2 * | 1/2006 | Arshansky et al. | 62/155 |
| 7,088,585 B2 | 8/2006 | Chu et al. | |
| 7,231,778 B2 * | 6/2007 | Rigney et al. | 62/407 |
| 7,284,709 B2 * | 10/2007 | Guyer | 237/12.1 |
| 2002/0112636 A1 * | 8/2002 | Desaulniers et al. | 101/487 |
| 2003/0140638 A1 * | 7/2003 | Arshansky et al. | 62/155 |
| 2005/0126747 A1 * | 6/2005 | Chu et al. | 165/11.1 |
| 2005/0161521 A1 * | 7/2005 | Guyer | 237/12.1 |
| 2005/0210910 A1 * | 9/2005 | Rigney et al. | 62/407 |

OTHER PUBLICATIONS

"Knürr CoolTrans, The Reliable Link Between Water Circulation Systems in the Building and the Server Rack", Emerson Electric Co., 2008, 6 pages.

* cited by examiner

*Primary Examiner* — Mohammad Ali
(74) *Attorney, Agent, or Firm* — Brinks Hofer Gilson & Lione

(57) ABSTRACT

An equipment cooling system and method employing modular scalable coolant distribution units that interface with each other to provide liquid cooling for computer data centers. The coolant distribution unit (CDU) permits the use of elevated water temperatures without increasing the load on the computer room air conditioning. A control unit processes environment data to control pump and valve components supporting redundancy and multiple primary and secondary coolant loops.

20 Claims, 13 Drawing Sheets

MODULAR CDU INTERCONNECTION
MULTIPLE SOURCES, MULTIPLE RACKS, WITH MANIFOLDS

MODULAR SCALABLE COOLANT DISTRIBUTION UNIT

FIRST INDIVIDUAL CDU PARTIAL SCHEMATIC DIAGRAM

SECOND INDIVIDUAL CDU PARTIAL SCHEMATIC DIAGRAM

Modular Free Cooling System Overview

MODULAR CDU INTERCONNECTION
MULTIPLE SOURCES, MULTIPLE RACKS, WITH MANIFOLDS

MODULAR CDU INTERCONNECTION
MULTIPLE RACKS

MODULAR CDU INTERCONNECTION
MULTIPLE SOURCES

MODULAR SCALABLE OPERATION FLOW CHART

FRONT PERSPECTIVE VIEW FLOOR-MOUNT CDU

REAR PERSPECTIVE VIEW FLOOR-MOUNT CDU

FIRST PERSPECTIVE VIEW RACK-MOUNT CDU

SECOND PERSPECTIVE VIEW RACK-MOUNT CDU

MODULAR SCALABLE OPERATION FLOW CHART

MODULAR SCALABLE COOLANT DISTRIBUTION UNIT

RELATED APPLICATIONS

This application claims the benefit of U.S. Provisional Application No. 61/161,538, filed Mar. 19, 2009; this application is herein incorporated in its entirety by reference.

FIELD OF THE INVENTION

The invention relates to a system and method for incrementally controlling cooling of heat generating equipment, and more particularly, to a modular, scalable, coolant distribution unit (CDU). Embodiments support multiple primary and secondary coolant loops.

BACKGROUND OF THE INVENTION

Equipment racks and the data centers populated with them have generated more heat as their processing power increases. Computer room air conditioning (CRAC) systems are increasingly unable to meet the demand for cooling. Typical CRAC systems have been extensions of building air conditioning units used to cool office spaces. As data center cooling needs have increased, more specialized systems have appeared to meet cooling needs.

Some of today's cooling needs can be met by liquid cooling. For example, passive rear door air-liquid heat exchangers are reliable and can provide cooling energy cost savings. They are effective at dealing with data center 'hot-spots' and facilitate deployment of fully loaded racks. They offer space savings and flexibility for sites that have exceeded their cooling capacity.

Data center business needs add another variable to consider when solving cooling needs. Typically, data center cooling solutions require enough thermal capacity to support the expected maximum heat load. However, this maximum load may not be reached for months or years as facility requirements start small and grow with business demand. This leads to unnecessary up-front capital costs and inefficiencies. Cooling systems operated below their capacity can be inefficient, further adding to the cost of operating a facility. The reverse is also possible. Heat load can decrease through implementation of virtual servers and conversion of servers to mainframes. It should, therefore, also be possible to incrementally remove cooling capacity.

Increased utility costs apply increased pressure to find efficient sources for whatever amount of cooling is required. Existing CRAC solutions do not provide comprehensive approaches to solve these needs.

Due to the high amount of energy used in cooling, small efficiency improvements have a large impact on the bottom line of data centers. Fractional percentage changes save thousands and can provide rapid returns on investment.

Reliability demands on data centers suggest that each component also needs to be dependable and should support backup operation when part of the cooling system fails.

There is a need for an efficient, scalable, system and method for reliably meeting the changing cooling needs of enterprises operating heat-generating equipment.

SUMMARY OF THE INVENTION

A system and method are described for a reliable modular cooling system supporting multiple coolant distribution units (CDUs). CDUs can be combined to support multiple primary coolant loops and multiple secondary coolant loops. Units can be added or removed as needed. These aspects provide integrated, incremental cooling for changing heat loads.

The modularity of the system reduces up front costs and permits installation of only components initially needed. It supports any size or tier level data center and supports an air and liquid cooling solution. The system handles workload variations. While rack population density may cause heat load to vary from under one to over thirty kilowatts, workload variations for a given rack can similarly cause a large heat load variation. For example, processors running complex simulations will be at full power, requiring maximum cooling. This may then be followed by idle time producing minimal heat load. The modular CDU efficiently accommodates these cases. Container-based implementations are also possible and can employ remote web interface control.

Other benefits include isolation of high quality water and cooling components from the lower quality water that typically comes from the facility. CDUs can also maintain the equipment coolant temperature above room dew point, avoiding the need to manage condensate.

Embodiments include a modular scalable coolant distribution unit (CDU) comprising a primary coolant loop comprising connect coupling for fluid communication with at least one cooling source; a secondary coolant loop comprising connect coupling for fluid communication with at least one equipment heat exchanger; an expansion tank in the secondary coolant loop; a heat exchanger in fluid communication with the primary coolant loop and in fluid communication with the secondary coolant loop wherein heat is exchanged between the primary coolant loop and the secondary coolant loop; at least one valve in the primary coolant loop return line; at least one pump in supply line of the secondary coolant loop; a first secondary coolant loop valve in the supply line of the secondary coolant loop between the at least one pump and an expansion tank; an automatic fill system in fluid communication with the supply line of the secondary coolant loop; at least one coolant temperature sensor for the secondary coolant supply line; at least one dew point sensor monitoring dew point of facility housing the at least one equipment heat exchanger; a second secondary coolant loop valve in the secondary supply line between the pump and the at least one equipment heat exchanger; a controller in communication with at least the at least one valve in the primary coolant loop return line, the at least one pump, the at least one dew point sensor, and the at least one coolant temperature sensor. Multiple characteristics of the at least one valve in the primary coolant loop, the at least one pump, and the at least one coolant temperature sensor are configured to balance heat transfer between the at least one cooling source and the at least one equipment heat exchanger. When in operation, the CDU delivers conditioned coolant to the at least one equipment heat exchanger from the at least one cooling source.

Further embodiments provide that at least one equipment heat exchanger is at least one rear door heat exchanger; and at least one equipment heat exchanger is at least one passive rear door heat exchanger. In other embodiments, the heat exchanger is a stainless-steel brazed-plate heat exchanger; and the heat exchanger is external to the expansion tank. For yet another embodiment, the valve in the primary coolant loop return line comprises a three-way valve in the primary coolant loop between primary coolant loop return line, the heat exchanger and primary coolant loop supply line by way of primary coolant loop bypass line. Other embodiments provide that the automatic fill system is connected to the expansion tank; and the at least one coolant temperature sensor for the secondary coolant supply line is opposite heat exchanger side of the at least one pump. One embodiment includes an interface with at least one free-cooling source wherein the interface comprises at least one free-cooling sensor measuring at least one free-cooling cooling source; free-cooling control software monitoring the free-cooling source and cooling environment; at least one free-cooling control valve capable of directing cooling among a plurality of CDUs; and at least one rear door liquid heat exchanger.

In other embodiments, a floor-mount CDU supports up to about approximately 12 rear door equipment heat exchangers (RDHxs); or the CDU is a rack-mounted CDU, the rack-mounted CDU occupying 6 U height in a 19 inch EIA COMPLIANT enclosure, supporting up to two rear door equipment heat exchangers (RDHxs), providing up to 20 kW cooling capacity. For still further embodiments, up to six rack-mounted CDUs are joined together in series, thereby supporting up to twelve RDHxs. Another embodiment provides redundant variable speed pumps, actuators, and control valves. Yet another embodiment provides that the at least one valve in the primary coolant loop return line modulates heat rejected to the primary coolant loop whereby water in the secondary loop is maintained in a non-condensing condition about approximately two degrees centigrade above dew point of the facility, whereby all cooling is sensible, even as temperature and humidity vary.

Embodiments include a modular scalable coolant distribution unit (CDU) cooling method comprising providing a CDU comprising a primary coolant loop comprising connect coupling for fluid communication with at least one cooling source; a secondary coolant loop comprising connect coupling for fluid communication with at least one equipment heat exchanger; an expansion tank in the secondary coolant loop; a heat exchanger in fluid communication with the primary coolant loop and in fluid communication with the secondary coolant loop wherein heat is exchanged between the primary coolant loop and the secondary coolant loop; at least one valve in the primary coolant loop return line; at least one pump in supply line of the secondary coolant loop; a first secondary coolant loop valve in the supply line of the secondary coolant loop between the at least one pump and an expansion tank; an automatic fill system in fluid communication with the supply line of the secondary coolant loop; at least one coolant temperature sensor for the secondary coolant supply line; at least one dew point sensor monitoring dew point of facility housing the at least one equipment heat exchanger; a second secondary coolant loop valve in the secondary supply line between the pump and the at least one equipment heat exchanger; a controller in communication with at least the at least one valve in the primary coolant loop return line, the at least one pump, the at least one dew point sensor, and the at least one coolant temperature sensor, wherein multiple characteristics of the at least one valve in the primary coolant loop, the at least one pump, and the at least one coolant temperature sensor are configured to balance heat transfer between the at least one cooling source and the at least one equipment heat exchanger; and delivering, wherein when in operation, conditioned coolant to the at least one equipment heat exchanger from the at least one cooling source.

For another embodiment, the operation of floor-mounted CDU consumes about approximately 2,500 watts maximum electrical power, thereby operating cooling for up to 150 kW of heat generated by up to 12 equipment racks at less than 250 watts electrical power per equipment rack comprising a passive rear door heat exchanger. Other embodiments provide the further steps of supplying make up water supplied by dual automatic fill pumps to supply to the secondary loop; and filling with treated water by pumps drawing treated water from an on-board reservoir in the CDU exclusive of an external water source. Yet more embodiments include filtering by a water filtration system for the secondary and primary loops whereby flushing is performed without interrupting unit operation; measuring flow of chilled water through the primary loop with a flow meter; and regulating flow to each of a plurality of equipment heat exchangers by secondary distribution flow regulators.

One additional embodiment provides a modular scalable coolant distribution unit (CDU) system comprising a primary coolant loop comprising connect coupling for fluid communication with at least one cooling source; a secondary coolant loop comprising connect coupling for fluid communication with at least one passive rear door equipment heat exchanger; an expansion tank in the secondary coolant loop; a stainless steel brazed plate heat exchanger, external to the expansion tank, in fluid communication with the primary coolant loop and in fluid communication with the secondary coolant loop wherein heat is exchanged between the primary coolant loop and the secondary coolant loop; at least one valve in the primary coolant loop return line, wherein the at least one valve in the primary coolant loop return line comprises a three-way valve in the primary coolant loop between primary coolant loop return line, the heat exchanger and primary coolant loop supply line by way of primary coolant loop bypass line; at least one pump in supply line of the secondary coolant loop; wherein the at lest one secondary coolant loop pump is magnetically driven and fill pumps are self-priming; a first secondary coolant loop valve in the supply line of the secondary coolant loop between the pump and the expansion tank; an automatic fill system in fluid communication with the supply line of the secondary coolant loop connected to the expansion tank; at least one coolant temperature sensor for the secondary coolant supply line opposite heat exchanger side of the pump; at least one dew point sensor monitoring dew point of facility housing the at least one equipment heat exchanger; a second secondary coolant loop valve in the secondary supply line between the pump and the at least one equipment heat exchanger; a controller in communication with at least the at least one valve in the primary coolant loop return line, the at least one pump, the at least one dew point sensor, and the at least one coolant temperature sensor, wherein multiple characteristics of the at least one valve in the primary coolant loop, the at least one pump. The at least one coolant temperature sensor is configured to balance heat transfer between the at least one cooling source and the at least one equipment heat exchanger; wherein the CDU system is capable of controlling secondary supply water temperature based on user selectable methods, fixed set point, fixed set point with dew point override or dew point tracking with adjustable offset; wherein the modular scalable CDU supports incremental capacity increase and component redundancy, providing an interface for at least one free-cooling source; and wherein when in operation, the CDU delivers conditioned coolant to the at least one heat exchanger from the at least one cooling source, thereby reducing heat load on at least one air conditioning unit.

A further embodiment comprises a modular scalable coolant distribution unit (CDU) comprising an interface for at least a second CDU.

Other embodiments include a modular scalable coolant distribution unit (CDU) comprising a primary loop; a secondary loop; a brazed plate heat exchanger wherein heat is exchanged between the primary loop and the secondary loop; a 3-way valve in the primary loop between primary loop supply line, heat exchanger and primary loop return line; an expansion tank in the supply line of the secondary loop; a pump in the supply line of the secondary loop; a valve in the supply line of the secondary loop between the pump and the expansion tank; an automatic fill system connected to the expansion tank in the secondary supply; a coolant temperature sensor for the secondary supply line opposite the heat exchanger side of the pump; a valve in the supply line of the secondary loop between the pump and the coolant temperature sensor; a controller in communication with the primary loop control valve, the pump, and the coolant temperature sensor; an air temperature and humidity sensor operatively coupled to the controller; and wherein the modular scalable CDU supports incremental capacity increase and/or redundancy and an interface for at least one free-cooling source.

In yet another embodiment, a cooling system and method comprising at least one coolant distribution unit (CDU) provides cooling to at least one electronics rack rear door air to liquid heat exchanger in a data center cooling environment. It comprises an interface with at least a second CDU, wherein the interface has at least one cooling environment sensor that measures the cooling environment. It has control software monitoring the cooling environment, at least one cooling environment control valve capable of directing cooling among a plurality of CDUs, and at least one rear door liquid heat exchanger. It also has an interface with at least one free-cooling source wherein the interface comprises at least one free-cooling sensor measuring at least one free-cooling cooling source. It has free-cooling control software monitoring the free-cooling source and cooling environment, at least one free-cooling control valve capable of directing cooling among a plurality of CDUs, and at least one rear door air to liquid heat exchanger.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The accompanying drawings are not intended to be drawn to scale. For clarity, not every component may be labeled in every drawing.

DETAILED DESCRIPTION

Figure 1:
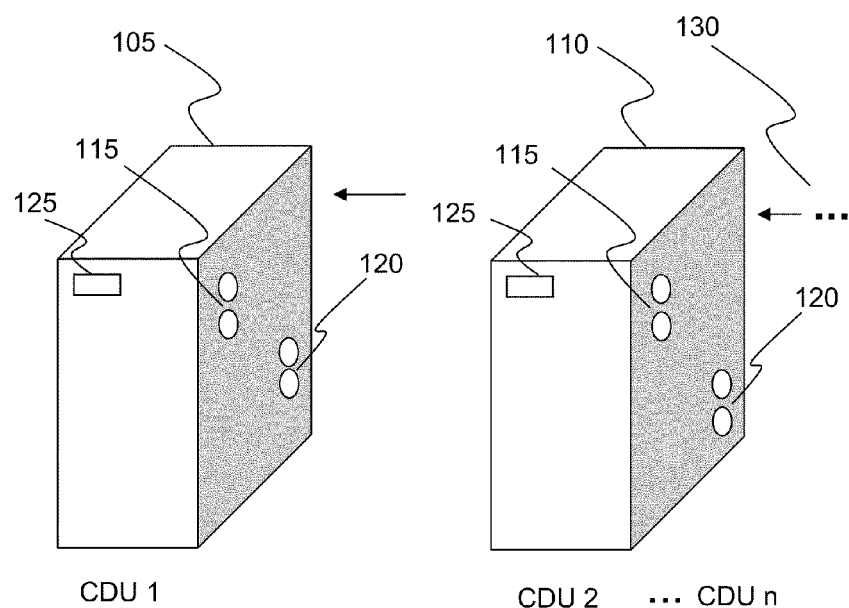
FIG. 1 depicts components of a cooling system with multiple modular scalable CDUs configured in accordance with an embodiment.

The invention is susceptible of many embodiments. What follows is illustrative, but not exhaustive, of the scope of the invention.

As used here, heat generating equipment comprises electronics or computer systems or subsystems requiring cooling. Equipment may be contained in any enclosure, housing, cabinet, frame or rack.

Coolant is not limited to water. It may comprise an antifreeze solution, a chemical coolant, or a refrigerant as examples. Facility water or facility coolant refers to the facility data center water or coolant in the primary loop. The term system coolant refers to the coolant circulating between a CDU and the component being cooled in the secondary loop. Utilizing separate circuits for the facility and system coolants improves reliability by isolating the relatively poor quality facility water source from the high quality system coolant.

Coolant Distribution Units provide for an energy efficient liquid cooling system. The use of a CDU creates a secondary loop that offers multiple advantages. A secondary loop allows users to have strict control over the liquid cooling system. It makes it easier to manage the quality of the chilled water, minimizes the volume of water and allows the water to be delivered at a lower pressure. The CDU provides a secondary loop of heat rejecting liquid which enables strict containment and control of the liquid cooling system. Using a CDU results in a secondary loop that has low pressure and requires low volume of chilled water to cool equipment heat exchangers such as the RDHx. Additionally, in embodiments, the CDU's sound power at 3 m in any direction does not exceed 55 dBA.

A management feature of embodiments of the CDU is its monitoring of the environmental conditions within the data center and its ability to maintain the secondary loop supply temperature above the dew point of the data center, preventing condensation and ensuring 100% sensible cooling. The controller interfaces with building management systems and web management tools, allowing users to actively monitor the system.

Floor-mount CDU embodiments are designed with redundant variable speed pumps, actuators and control valves, maximizing system availability. Available with a 120 kW or 150 kW cooling capacity, the CDU can easily support up to 12 RDHx. Providing approximately 43 tons of cooling, the CDU consumes ¼ of the electricity that a comparable Computer Room Air Conditioner (CRAC) consumes. Embodiments include a variety of secondary loop distribution options providing maximum flexibility.

Rack-mount CDU embodiments support small data centers, wiring closets and can address a small hot spot within a large data center. Embodiments of the rack-mount CDU are 6 U high units that mount within a 19" EIA IT enclosure. With a 20 kW cooling capacity, it is a cost effective method to cooling one or two adjacent IT enclosures.

Nonlimiting examples of CDU benefits include: maintaining chilled water above the room dew point to ensure 100% sensible cooling; monitoring heat load and making adjustments to minimize energy consumption; isolating secondary loop enabling proper water treatment for long life and reliability; allowing quick and easy addition of RDHx; intelligent monitoring and management; rack-mount embodiments providing 20 kW capacity; floor-mount embodiments providing 120 kW and 150 kW capacity; and floor-mount models offering redundant components for system availability.

Some equipment heat exchangers such as the RDHx, for simplicity and maximum reliability, do not have a mechanism to balance water flows. This is handled by the CDU. CDU embodiments have adjustable flow regulators. Specific high density racks can have increased water delivered to them; otherwise, any heat not treated by the RDHx can be captured and cooled by adjacent RDHx units.

CDUs and RDHx units can obviate the need for hot aisle/cold aisle arrangement of IT enclosures. When the RDHx is deployed on all enclosures and they are fully neutralizing the rack heat load, a cold aisle/cold aisle arrangement can be used.

Embodiments of the CDU have a temperature/humidity sensor on board to measure the dew point. Only a single sensor is needed since dew point is consistent throughout a data center even if the temperature and humidity vary. Embodiments have remote sensor mounting.

Floor-mount embodiments allow for full service access from the front and rear, allowing units to be placed within a row of equipment racks, or full service access from the front and one side, allowing units to be placed against a wall.

For embodiments, secondary loop circulating pumps are self-priming and magnetically driven. Minimum available flow rates include 10 GPM (38 L/min) with 15.7 feet (2.5 Bar) of external head and 65 GPM (240 L/min) with 50 feet (150 kPa) of external head. Unit embodiments are equipped with dual pumps for redundancy, pumps auto-rotate for run time balancing and auto-switch over in case of pump failure. Pump embodiments are inverter driven for variable speed operation and soft start. Isolation valves are provided for each pump to facilitate pump replacement while the system remains operational. A modulating chilled water valve controls the flow of chilled water on the primary side of the heat exchanger. The valve actuator responds to changes in room dew point temperature to control the supply temperature for cooling with no condensation. Embodiments are equipped with isolation valves for primary chilled water supply and return connections. The system allows for field selection of top or bottom piping options for primary side connections. Unit embodiments are equipped with a water filtration system for the secondary and primary loops with 300 microns (or better) filters that can be back flushed without interrupting unit operation. In embodiments, the CDU is equipped with a flow meter in the primary circuit to measure the flow of chilled water through the primary loop. Embodiments are equipped with dual automatic fill pumps to supply make up water to the secondary loop. Fill pumps draw treated water from an on-board reservoir in the CDU and do not require piping to an external water source. Heat exchanger embodiments are brazed-plate type, constructed of stainless-steel plates. The primary side is piped to a chilled water source with an entering fluid temperature of about approximately 45° F. (7.2° C.), with a flow rate of about approximately 6.6 GPM (25 L/min) or about approximately 65 GPM (240 L/min).

Embodiments include a microprocessor controller display mounted on front of unit for user interface accessible without removing exterior panels. The CDU system is capable of controlling secondary supply water temperature based on user selectable methods, fixed set point, fixed set point with dew point override or dew point tracking with adjustable offset. A remote mountable sensor is provided with embodiments to measure/calculate the dew point of the room. The microprocessor supports remote management.

Embodiment controllers display the following: power on status; primary water supply temperature; primary water flow rate; secondary supply temperature; secondary temperature set point; dew point; temperature offset set point; pump speed; pump operating hours; control valve position; control valve operating hours. CDU embodiments generate alarms during the following events: low primary flow; high primary water temperature; low primary water temperature; flow control valve failure; primary filter flush required; low secondary flow; low secondary water temperature; high secondary water temperature; secondary system over pressure; pump failure; pump overload; pump high pressure; pump low pressure; inverter failure; leak detected; low tank level; temperature sensor fail; pressure sensor fail; room sensor fail; and under floor leak detection.

Some embodiments include an internal distribution manifold. Internal secondary distribution manifold embodiments support up to 6 RDHx. Manifolds are equipped with ¾" ISO-B quick release couplings for both supply and return connections in embodiments. Female sockets are used for supply water connection, with male nipples for return water connections in embodiments. Embodiments with manifolds have flow regulators for each secondary loop circuit to allow for reducing flow to each RDHx independently. Embodiments provide flexible tails for the secondary loop connection. They support the use of an external distribution manifold. Flexible tails can have 1½" sweat connections.

If the CDU cabinet has been installed with less than the full capacity of RDHx attached, additional RDHx's can be connected while the system is operational without the need to shut down. The sequence to attach additional racks (with optional internal manifolds installed) follows. Close flow balancing valve for the new circuit; provide deionized water to fill the new circuit; place the filling wand into the container of water; connect supply hose of the new RDHx to supply manifold at the back of the CDU cabinet, using the quick release coupling; open flow balancing valve allowing water to enter the new circuit; open air vent points on the RDHx to allow trapped air to escape; as the pressure in the secondary circuit drops, the fill pumps automatically come on to top up the system with new fluid; once all the air has been vented from the RDHx and the fill pumps have stopped, i.e. pressure has been re-established, connect the return hose of the RDHx to the return manifold at the back of the CDU cabinet, using the quick release coupling; the remaining air in the return hose will now be pushed into the CDU cabinet to be vented via the inbuilt automatic air vent and the fill pumps will start again. Once the fill pumps have stopped, run the system for 10 to 15 minutes with this reduced flow in the new circuit, then fully open the flow/balancing valve to allow the valve to control to about approximately 40 L/M (10.6 USgpm).

Remote Web/SNMP Communication embodiments provide a gateway to allow remote monitoring of up to 8 CDUs via web browser and SNMP traps. Embodiment gateways are rack mountable in 19" EIA-310 compliant equipment enclosures. MODBUS communications embodiments provide a gateway to allow remote monitoring of 8 CDUs via RS485 connection to a building management system.

For rack-mount CDU embodiments, a hose splitter allows one CDU Module to support two RDHx. Embodiments for the hose splitter are equipped with ¾" ISO-B quick release couplings for both supply and return connections; a female socket is used for supply water connection, a male nipple is used for return water connection. For rack-mount CDU embodiments, a remote mounted sensor is provided to measure/calculate dew point of room. A communications card allows the controller to communicate with a LON network. A sensor link cable allows multiple CDU modules, mounted in a single enclosure, to be linked together so they can utilize a single remote dew point Sensor for control.

FIG. 1 is a depiction of components of a cooling system embodiment 100 with multiple modular scalable CDUs 105 and 110. Each unit comprises primary connection 115, secondary connection 120, and information display 125. Multiple CDUs are connected together (additional units indicated by ellipsis 130) to provide added capacity and or redundancy. An additional module can be used for a secondary distribution manifold, or a field-supplied manifold can be used. In embodiments, modules can be added for each of multiple sources, including free-cooling.

Figure 2A:
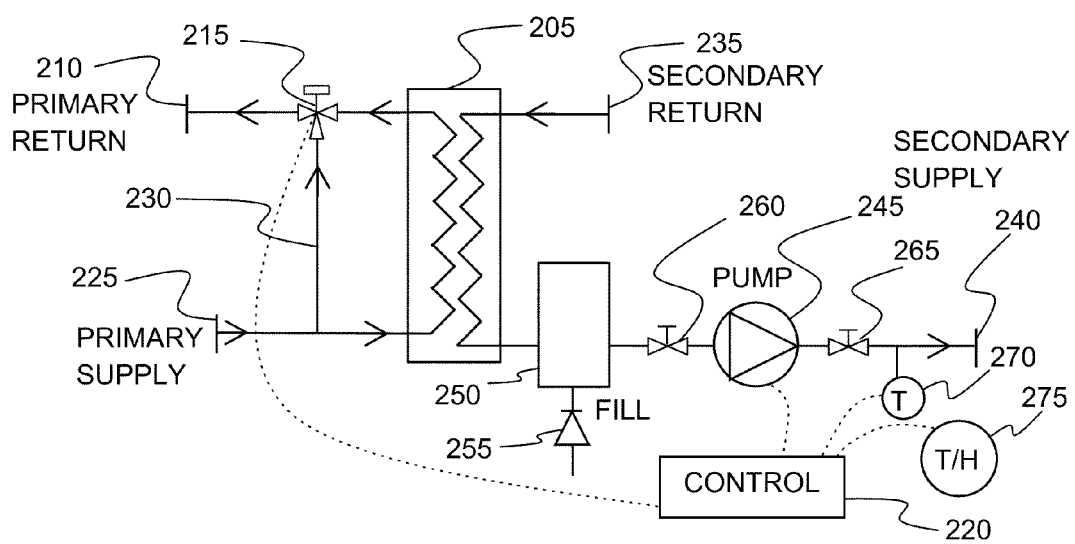
FIG. 2A is a first modular scalable CDU partial schematic diagram configured in accordance with an embodiment.

FIG. 2A illustrates a partial schematic of a first embodiment of a scalable modular CDU 200A with heat exchanger 205 including primary return 210 controlled by 3-way valve 215. In embodiments, heat exchanger 205 is a brazed plate heat exchanger. Valve 215 is controlled by control unit 220. Primary supply 225 feeds heat exchanger 205. Valve 215 controls flow between primary supply 225, primary return 210 (through primary coolant loop bypass line 230) and heat exchanger 205. Secondary return 235 is in fluid connection with heat exchanger 205. Secondary supply 240 includes pump 245. Pump 245 is connected to control unit 220. Between pump 245 and heat exchanger 205 is expansion tank 250. Connected to expansion tank 250 is automatic fill system 255. Between expansion tank 250 and pump 245 is first secondary supply valve 260. After pump 245 in secondary supply 240 is second secondary supply valve 265. After valve 265 in secondary supply 240 is coolant temperature sensor 270. Coolant temperature sensor 270 is connected to control unit 220. Air temperature and humidity (T/H) sensor 275 is also connected to control unit 220. Components of FIG. 2B with similar functions are similarly labeled.

Figure 2B:
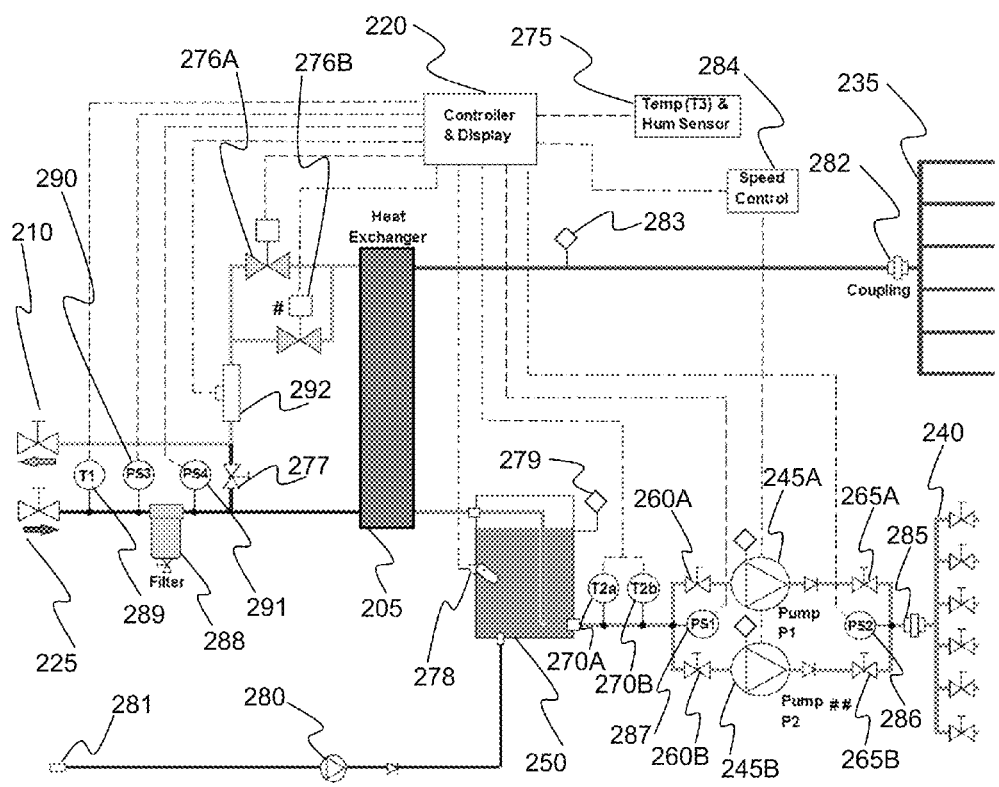
FIG. 2B is a second modular scalable CDU partial schematic diagram configured in accordance with an embodiment.

FIG. 2B illustrates a partial schematic of a second embodiment of a scalable modular CDU 200B with heat exchanger 205 including primary return 210 controlled by control valves 276A & B. In embodiments, control valve control valve 276B is redundant. In embodiments, heat exchanger 205 is a stainless steel brazed plate heat exchanger. Valves 276A & B are controlled by control unit 220. Primary supply 225 feeds heat exchanger 205. Bypass valve 277 controls flow between primary supply 225 and primary return 210. Secondary return 235 is in fluid connection with heat exchanger 205. In embodiments, secondary return 235 comprises internal manifolds or flexible tails, coupling 282 and air eliminator 283. Secondary supply 240 includes pumps 245A & B. In embodiments, pump 245B is redundant. Pumps 245A & B are connected to control unit 220 via speed control 284. Between pumps 245A & B and heat exchanger 205 is auto fill expansion tank 250. Connected to auto fill expansion tank 250 is automatic fill system comprising level sensor 278 (connected to controller 220), air eliminator 279, priming pump 280, and fill point 281. Between expansion tank 250 and pumps 245A & B are first secondary supply valves 260A & B. After pumps 245A & B in secondary supply are second secondary supply valves 265A & B. Between auto fill expansion tank 250 and first secondary supply valves 260A & B are coolant temperature sensors 270A & B. Coolant temperature sensors 270A & B are connected to control unit 220. Air temperature and humidity (T/H) sensor 275 is also connected to control unit 220. In embodiments, secondary supply 240 comprises flow control valves, quick release couplings, coupling 285, and pressure sensors 286 and 287. For embodiments, primary supply 225 comprises filter 288, temperature sensor 289, and pressure sensors 290 and 291. Embodiments provide flow meter 292 in primary return line, and primary return 210 and primary supply 225 each comprise valves.

Figure 3:
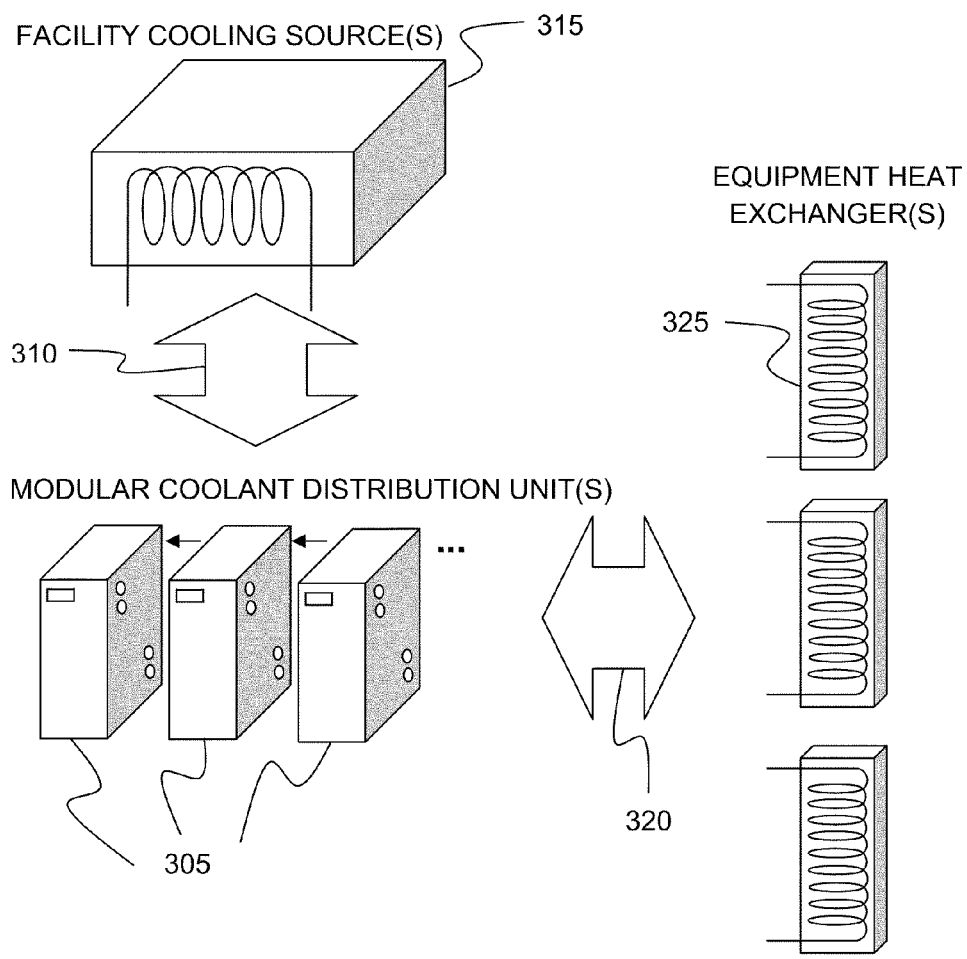
FIG. 3 is perspective diagram of a modular scalable CDU cooling system overview configured in accordance with an embodiment.

FIG. 3 is a perspective diagram of a modular scalable CDU cooling system overview embodiment 300 depicting multiple CDUs 305. CDUs 305 are connected by primary loop 310 to cooling source such as facility water 315. CDUs 305 are connected by secondary loop 320 to one or more equipment heat exchangers 325. As non-limiting examples, heat exchangers 325 can be equipment rack rear door liquid to air heat exchangers, room air heat exchangers, direct component liquid cooling heat exchangers, or any combination.

Figure 4:
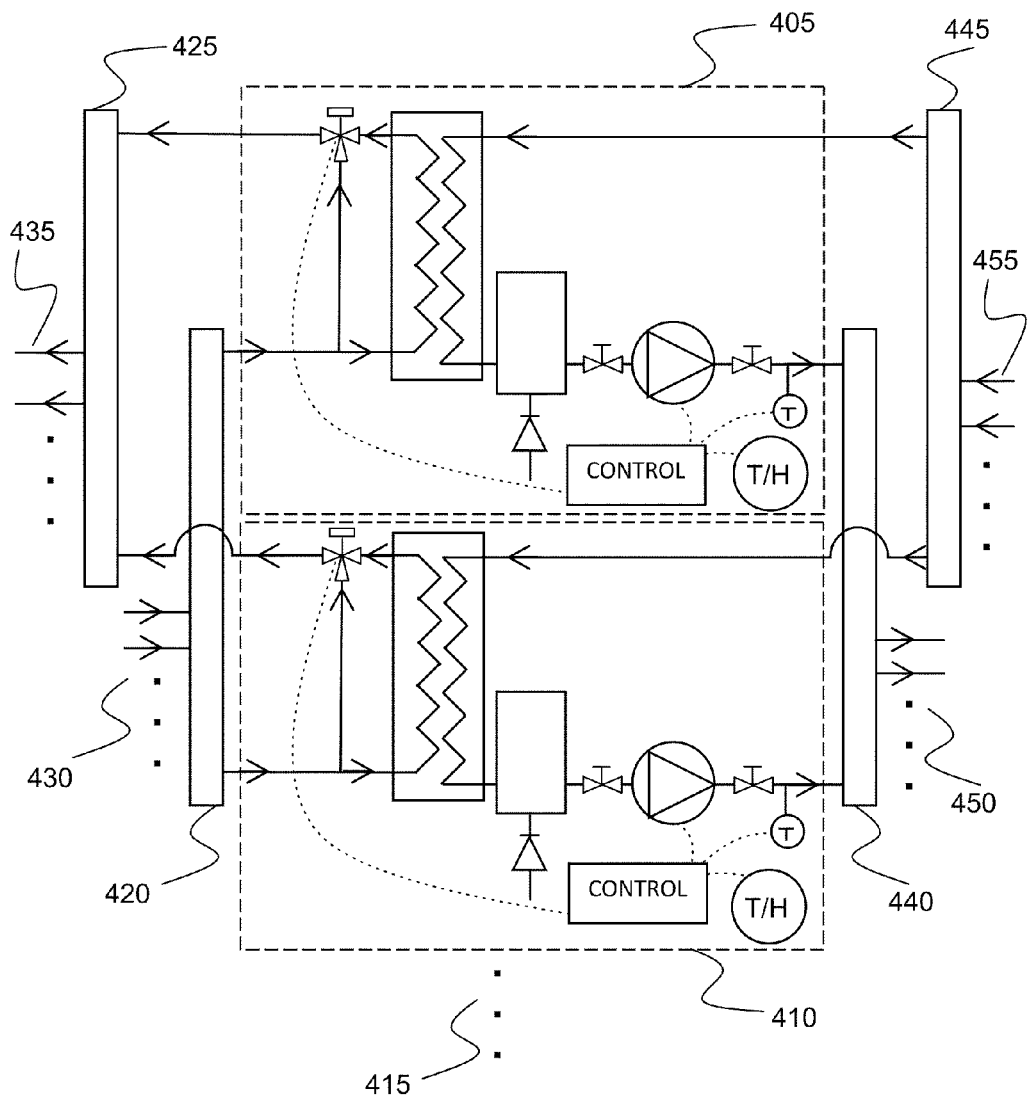
FIG. 4 is a modular scalable CDU system partial schematic diagram depicting interfaces with multiple sources and multiple equipment heat exchangers configured in accordance with an embodiment.

FIG. 4 is a modular scalable CDU system partial schematic diagram embodiment 400 depicting interfaces with multiple sources and multiple equipment heat exchangers. Individual modular scalable CDUs are depicted within dashed outlines 405 and 410. Units can be added as depicted by ellipsis 415. Additional units can serve as a secondary distribution manifold and support redundancy. The primary loop comprises primary supply manifold 420 and primary return manifold 425. Primary supply manifold 420 connects 430 to multiple coolant sources (not shown). Similarly, primary return manifold 425 connects 435 to multiple coolant sources (not shown). Multiple coolant sources can provide redundancy and or add optional free-cooling ability. The secondary loop comprises secondary supply manifold 440 and secondary return manifold 445. Secondary supply manifold 440 connects 450 to multiple equipment heat exchangers (not shown). Similarly, secondary return manifold 445 connects 455 to multiple equipment heat exchangers (not shown). Connections may employ quick-disconnect fittings for reconfiguration convenience.

Figure 5:
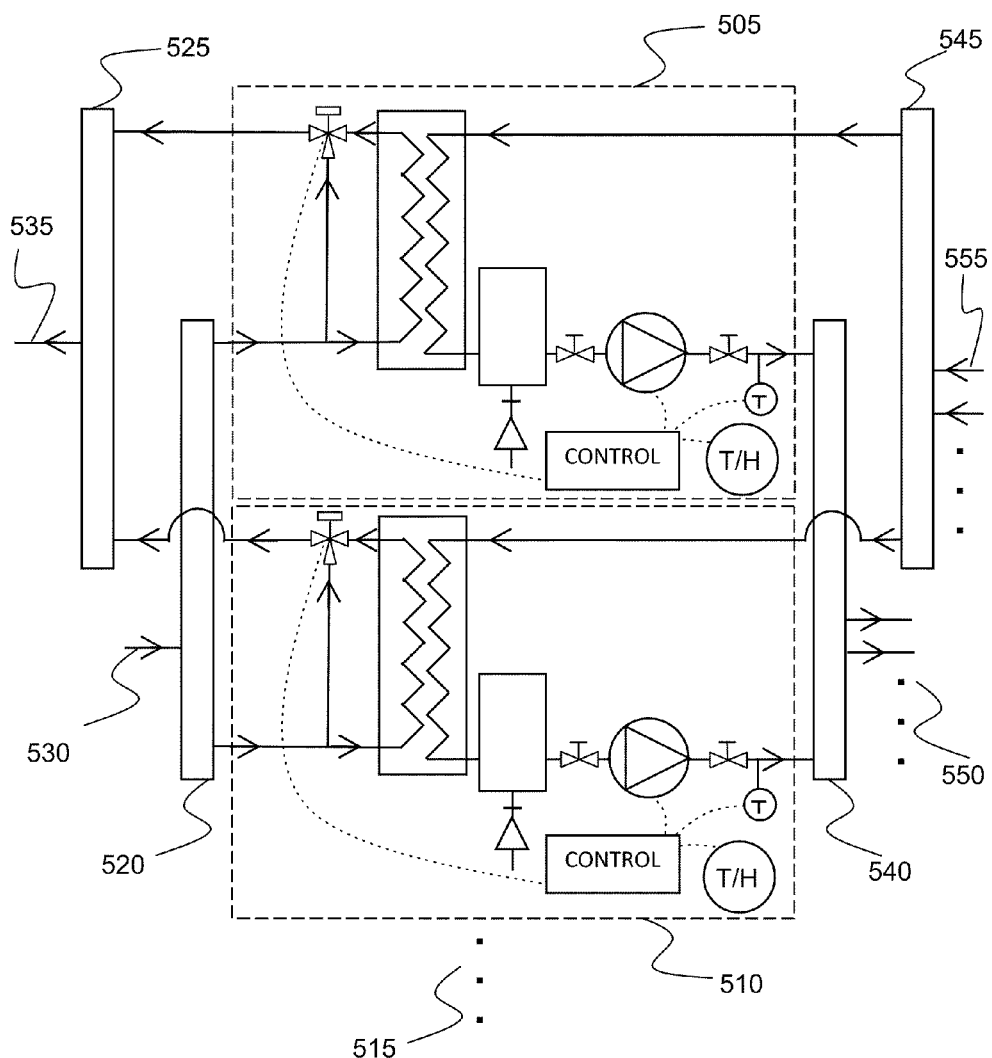
FIG. 5 is a modular scalable CDU system partial schematic diagram depicting interfaces with a single facility cooling source configured in accordance with an embodiment.

FIG. 5 is a modular scalable CDU system partial schematic diagram embodiment 500 depicting interfaces with a single facility cooling source. As with FIG. 4, individual modular scalable CDUs are depicted within dashed outlines 505 and 510. Units can be added as depicted by ellipsis 515. The primary loop comprises primary supply manifold 520 and primary return manifold 525. Primary supply manifold 520 connects 530 to a single facility coolant source (not shown). Similarly, primary return manifold 525 connects 535 to a single facility coolant source (not shown). The secondary loop comprises secondary supply manifold 540 and secondary return manifold 545. Secondary supply manifold 540 connects 550 to multiple equipment heat exchangers (not shown). Similarly, secondary return manifold 545 connects 555 to multiple equipment heat exchangers (not shown). Variants can include separate CDU connections to individual primary facility coolant circuits, omitting primary supply and return manifolds. Multiple CDUs fed by a single facility cooling source can be used to meet distinct needs of multiple, varied, secondary cooling loops. These could include passive and active liquid to air heat exchangers as found in rack doors or above rack hot-aisle equipment configurations.

Figure 6:
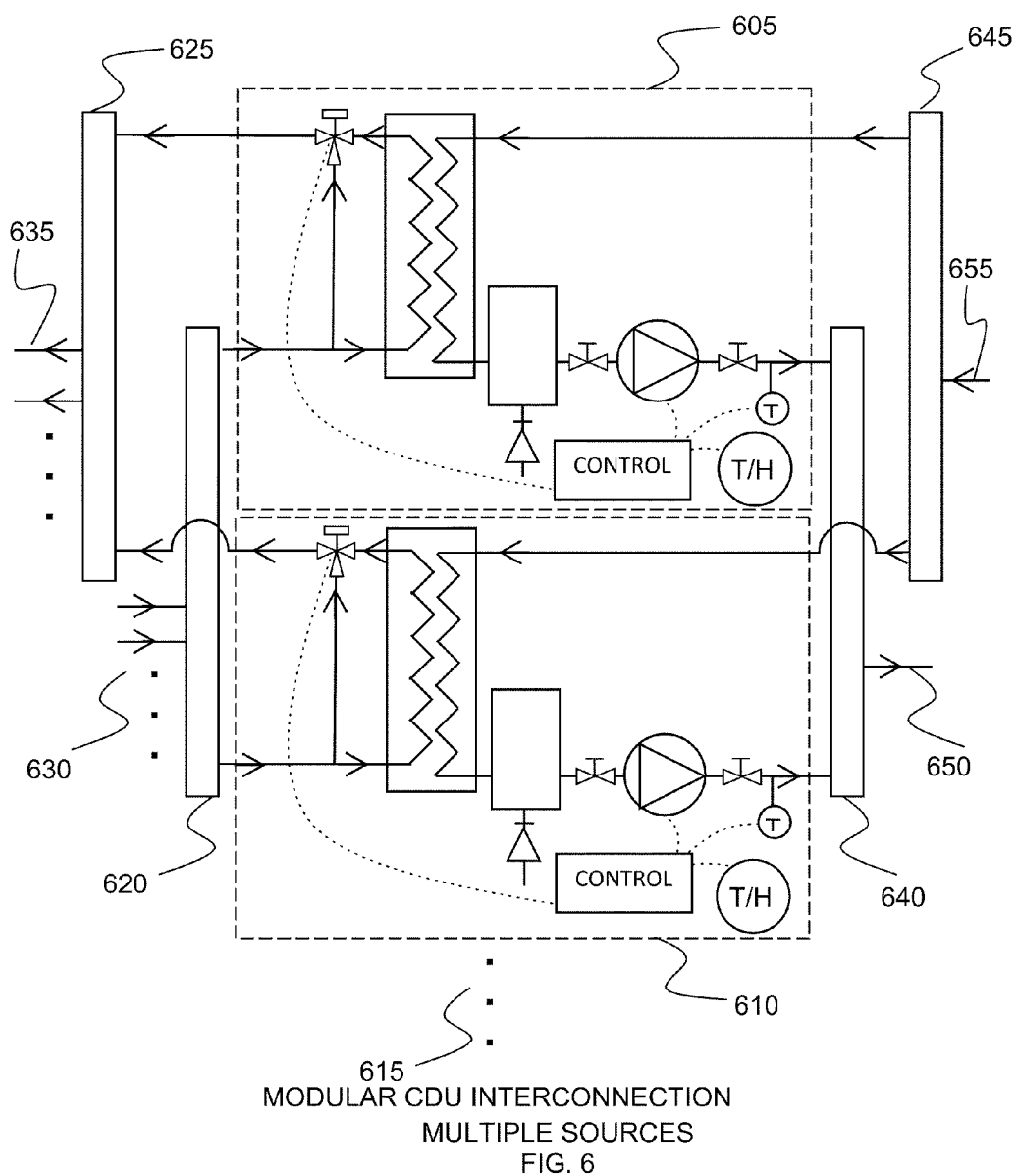
FIG. 6 is a modular scalable CDU system partial schematic diagram depicting interfaces with a single equipment heat exchanger system configured in accordance with an embodiment.

FIG. 6 is a modular scalable CDU system partial schematic diagram embodiment 600 depicting interfaces with a single equipment heat exchanger system. Again, as with FIG. 4, individual modular scalable CDUs are depicted within dashed outlines 605 and 610. Units can be added as depicted by ellipsis 615. The primary loop comprises primary supply manifold 620 and primary return manifold 625. Primary supply manifold 620 connects 630 to multiple coolant sources (not shown). Similarly, primary return manifold 625 connects 635 to multiple coolant sources (not shown). The secondary loop comprises secondary supply manifold 640 and secondary return manifold 645. Secondary supply manifold 640 connects 650 to a single equipment heat exchanger circuit (not shown). Similarly, secondary return manifold 645 connects 655 to a single equipment heat exchanger circuit (not shown). A heat exchanger circuit may comprise one or more heat exchangers. Variants can include separate CDU connections to individual secondary heat exchanger circuits, omitting secondary supply and return manifolds.

Figure 7:
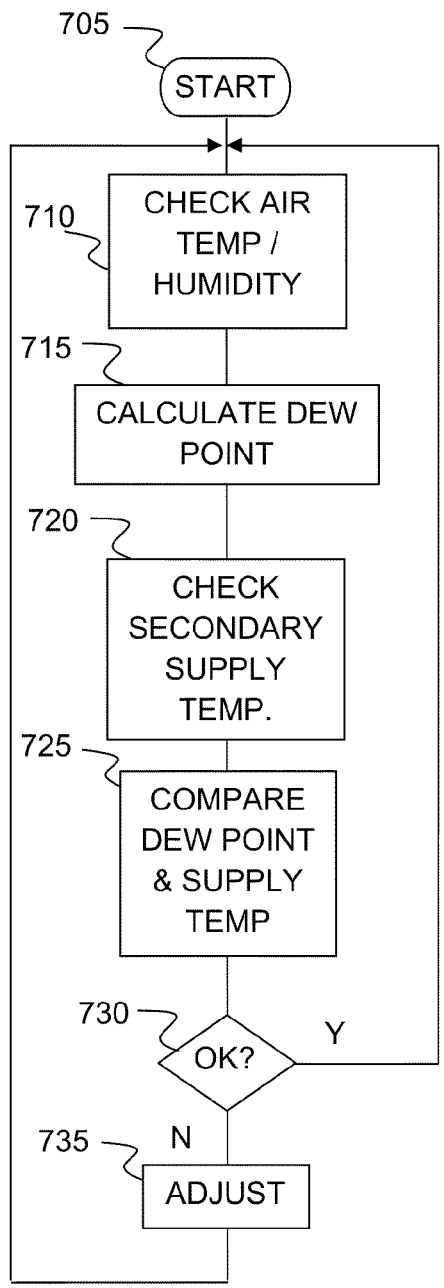
FIG. 7 is a flow chart of operation of a modular scalable CDU configured in accordance with an embodiment.

FIG. 7 is a flow chart embodiment 700 of operation of a modular scalable CDU. From start 705, the system checks the temperature and humidity of the air 710. Based on the results of that check, the system calculates the dew point 715. The system proceeds to check the temperature of the secondary loop supply 720. The results of 720 are compared to the dew point 715 in step 725. Based on the results of the comparison, at step 730 the system can make adjustments 735 or return to step 710. Adjustments can include pump speed and primary loop valve settings. Following adjustments 735, the system returns to check the air temperature and humidity at step 710. Control unit 220 of FIG. 2 can perform these steps within individual CDUs and in conjunction with additional CDUs. Data such as loop coolant temperature and air temperature and humidity can be used to balance heat loads derived from at least one secondary coolant loop among multiple CDUs and facility coolant sources. This can support redundancy. Should a CDU fail, additional CDUs connected to the secondary loop of the failed CDU provide additional cooling through, for example, a common manifold connection. Additional fluid connections are possible.

Figure 8:
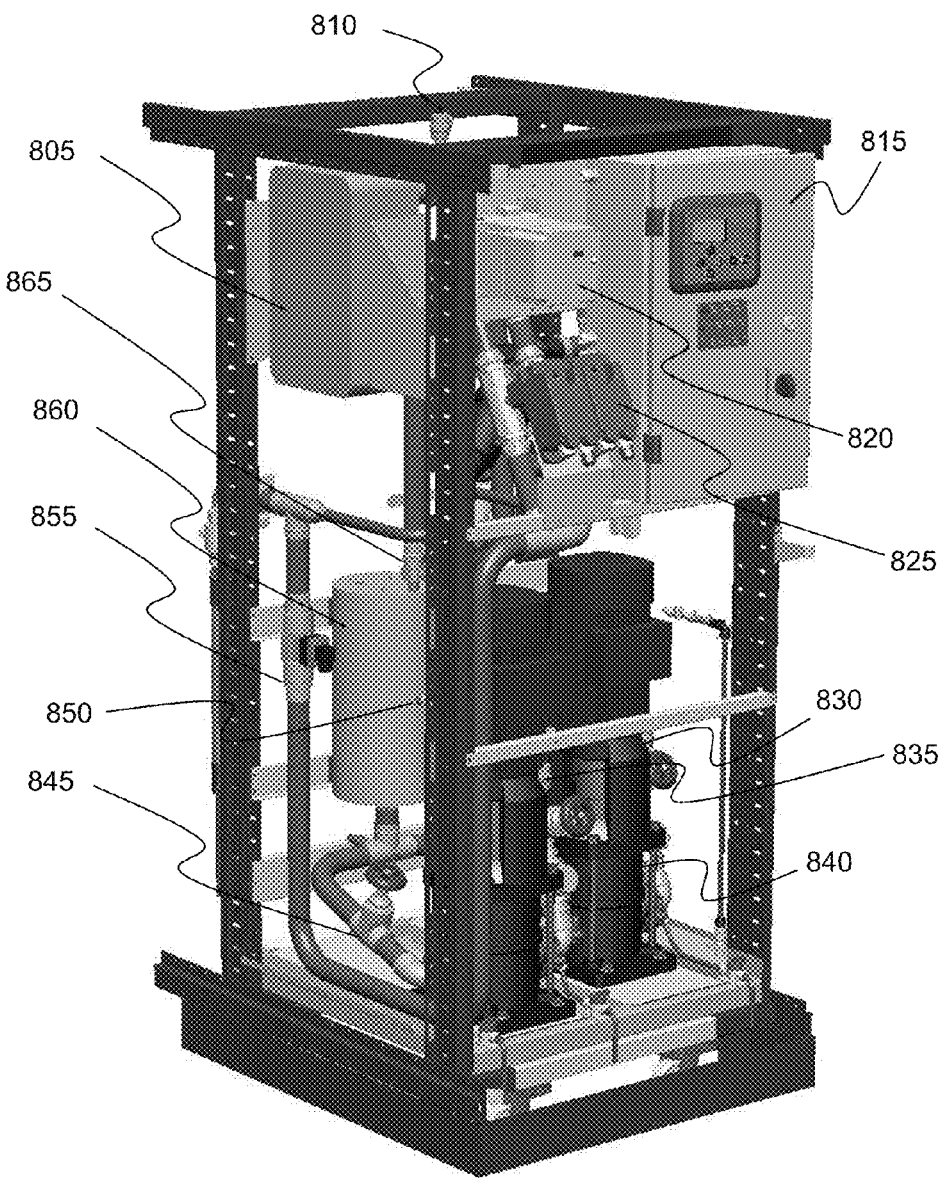
FIG. 8 is a first perspective diagram of a floor-mount CDU configured in accordance with an embodiment.

FIG. 8 is a front perspective diagram 800 of a floor-mount CDU. Components comprise heat exchanger 805, automatic air vent 810, controller panel with display 815, pump inverter drive 820, primary control valves 825, automatic air vents 830 and 835, secondary pumps (run & standby) 840, pump isolation valves 845, level switch 850, primary flow meter 855, reservoir tank 860, and automatic air vent 865.

Figure 9:
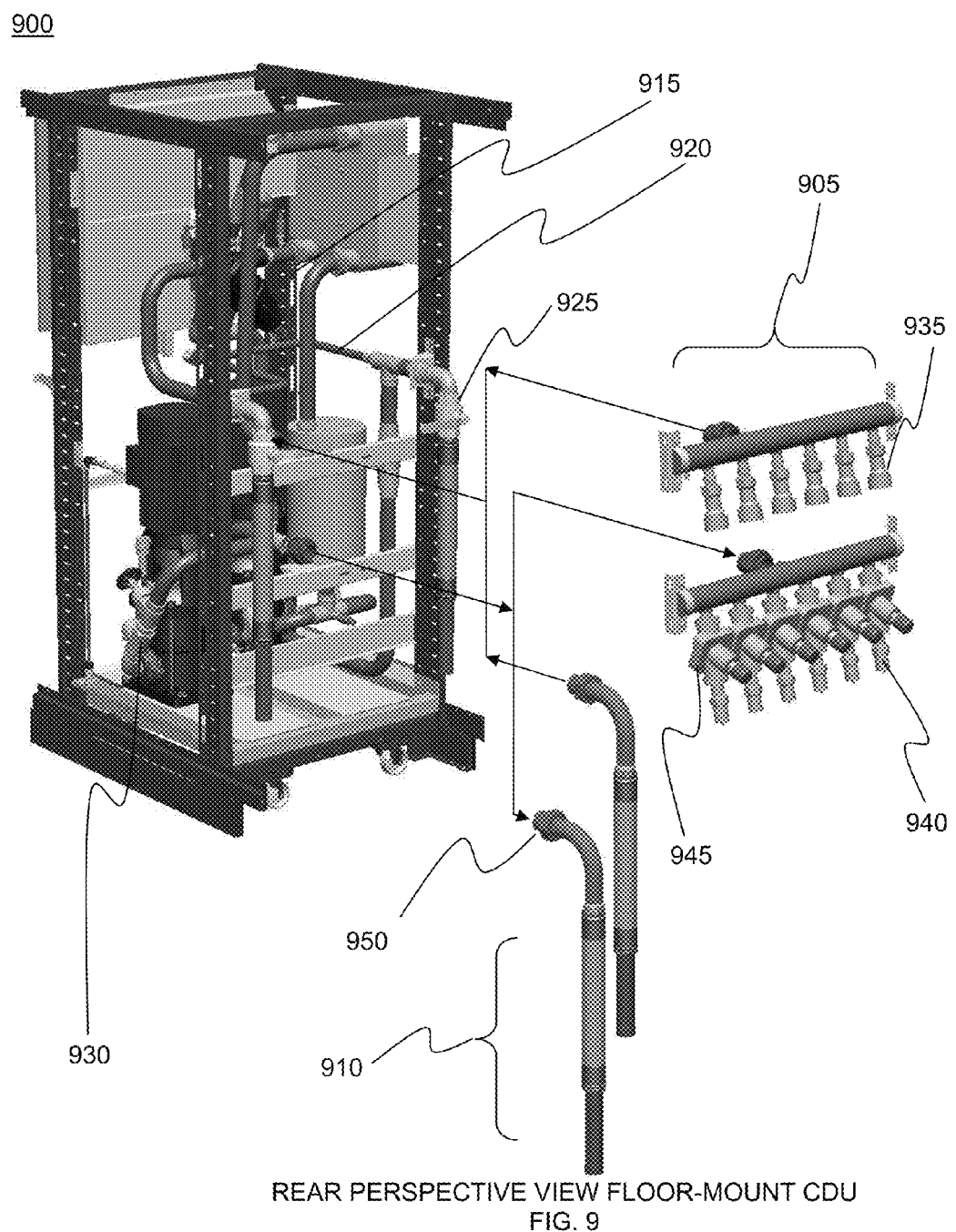
FIG. 9 is a second perspective diagram of a floor-mount CDU configured in accordance with an embodiment.

FIG. 9 is a rear perspective diagram 900 of a floor-mount CDU. Depicted are internal manifold embodiment components 905, and flex tail components for external manifold 910. Components comprise primary filter 915, primary by-pass circuit 920, primary isolation valves 925, and secondary pump non-return valve 930. Internal manifold components 905 comprise secondary return quick release coupling 935, secondary supply quick release coupling 940, and secondary flow control/balancing valves 945. External manifold components 910 comprise cone seat union couplings 950.

Figure 10:
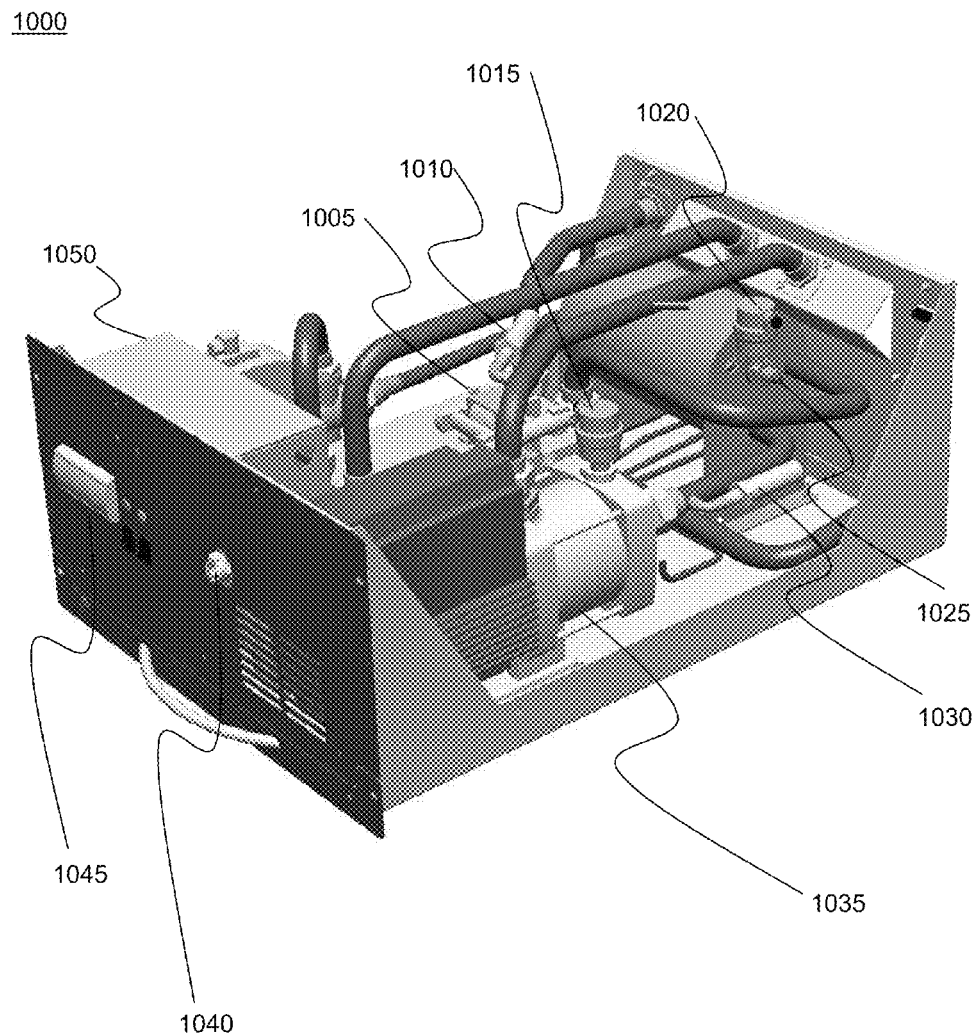
FIG. 10 is a first perspective diagram of a rack-mount CDU configured in accordance with an embodiment.

FIG. 10 is a first perspective diagram 1000 of a rack-mount CDU. Components comprise fill pump 1005, pressure sensor 1010, auto air vents 1015 and 1020, level sensor 1025, pressure sensor 1030, secondary/main pump 1035, fill pump connection point 1040, controller display for user interface 1045, and electrical compartment 1050.

Figure 11:
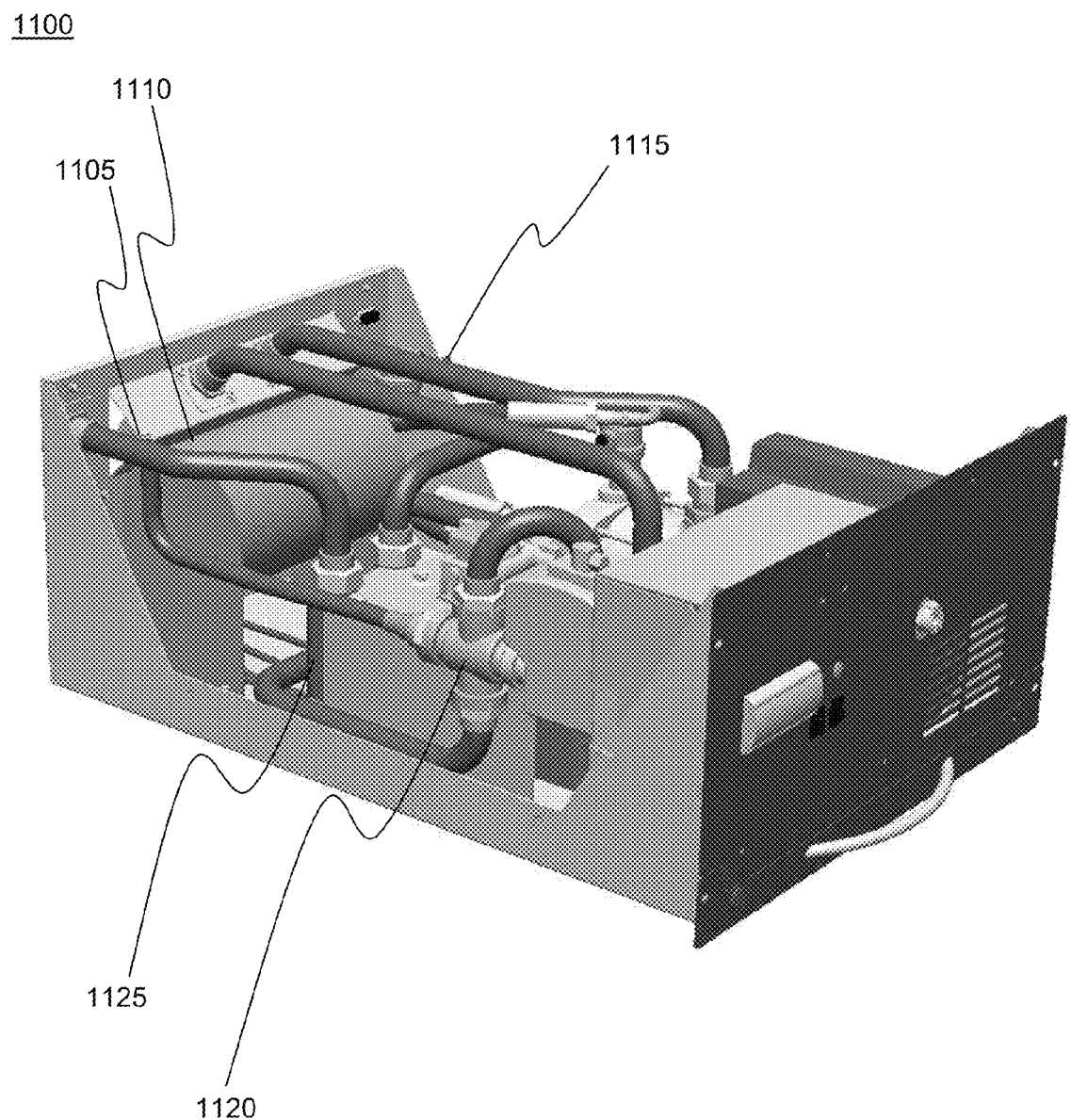
FIG. 11 is a second perspective diagram of a rack-mount CDU configured in accordance with an embodiment.

FIG. 11 is a second perspective diagram 1100 of a rack-mount CDU. Components comprise primary temperature sensor 1105, reservoir tank 1110, secondary temperature sensor 1115, three-way valve and actuator 1120, and plate heat exchanger 1125.

Figure 12:
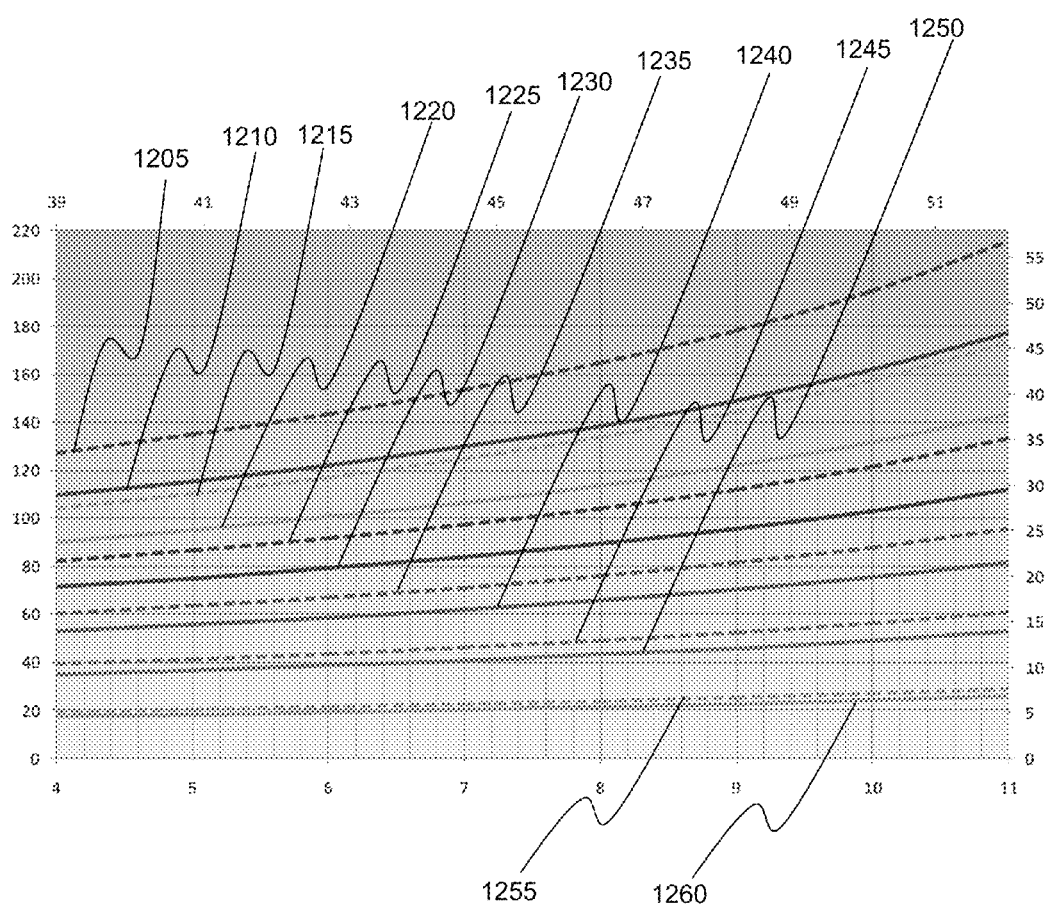
FIG. 12 is a chart depicting a primary flow/temperature graph configured in accordance with an embodiment.

FIG. 12 is a chart depicting a primary flow/temperature graph 1200. Scales are temperature in degrees F. top axis, degrees C. bottom axis, and flow L/M and USgpm left and right, respectively. For performance, the primary water flow rate should be set to an optimum flow. For this purpose, the number of RDHxs connected needs to be considered along with the temperature of the incoming water and level of added glycol. If the water flow is low, there may be insufficient cooling and the room temperature may rise. If there is too much flow, then the temperature control could become unstable. The graph is a guide for the primary water requirements, based on the number of RDHxs connected for either plain water or up to 30% ethylene glycol (different % of glycol can be estimated on a pro-rata basis). The primary water should fall either on the chosen curve or in the area above the curve. The water flow should not be more than 20% above the recommended value for stable control. The graph is based around a secondary supply temperature of 18° C. (64.4° F.) to achieve the full duty of 20 kW per RDHx for the 120 kW CDU and 25 kW per RDHx for the 150 kW CDU. For embodiments, the secondary supply manifold is fitted with an automatic flow control balancing valve for each circuit. These valves ensure that each circuit always receives the correct flow even if each circuit has a different pressure drop (e.g. due to longer supply/return hose length). Particular curves represent 6 RDHx with 30 percent glycol 1205, 6 RDHx with water 1210, 5 RDHx with 30 percent glycol 1215, 5 RDHx with water 1220, 4 RDHx with 30 percent glycol 1225, 4 RDHx with water 1230, 3 RDHx with 30 percent glycol 1235, 3 RDHx with water 1240, 2 RDHx with 30 percent glycol 1245, 2 RDHx with water 1250, 1 RDHx with 30 percent glycol (dashed) 1255, 1 RDHx with water (solid) 1260.

Other and various embodiments will be readily apparent to those skilled in the art, from this description, figures, and the claims that follow.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A modular scalable coolant distribution unit (CDU) comprising:
   a primary coolant loop comprising connect coupling for fluid communication with at least one cooling source;
   a secondary coolant loop comprising connect coupling for fluid communication with at least one equipment heat exchanger;
   an expansion tank in said secondary coolant loop;
   a heat exchanger in fluid communication with said primary coolant loop and in fluid communication with said secondary coolant loop wherein heat is exchanged between said primary coolant loop and said secondary coolant loop;
   at least one valve in said primary coolant loop return line;
   at least one pump in supply line of said secondary coolant loop;
   a first secondary coolant loop valve in said supply line of said secondary coolant loop between said at least one pump and an expansion tank;
   an automatic fill system in fluid communication with said supply line of said secondary coolant loop;
   at least one coolant temperature sensor for said secondary coolant supply line;
   at least one dew point sensor monitoring dew point of facility housing said at least one equipment heat exchanger;
   a second secondary coolant loop valve in said secondary supply line between said pump and said at least one equipment heat exchanger;
   a controller in communication with at least said at least one valve in said primary coolant loop return line, said at least one pump, said at least one dew point sensor, and said at least one coolant temperature sensor, wherein multiple characteristics of said at least one valve in said primary coolant loop, said at least one pump, and said at least one coolant temperature sensor are configured to balance heat transfer between said at least one cooling source and said at least one equipment heat exchanger; and wherein when in operation, said CDU delivers conditioned coolant to said at least one equipment heat exchanger from said at least one cooling source.

2. The modular scalable coolant distribution unit (CDU) of claim 1; wherein said at least one equipment heat exchanger is at least one rear door heat exchanger.

3. The modular scalable coolant distribution unit (CDU) of claim 1; wherein said at least one equipment heat exchanger is at least one passive rear door heat exchanger.

4. The modular scalable coolant distribution unit (CDU) of claim 1; wherein said heat exchanger is a stainless-steel brazed-plate heat exchanger.

5. The modular scalable coolant distribution unit (CDU) of claim 1; wherein said heat exchanger is external to said expansion tank.

6. The modular scalable coolant distribution unit (CDU) of claim 1; wherein said valve in said primary coolant loop return line comprises a three-way valve in said primary coolant loop between primary coolant loop return line, said heat exchanger and primary coolant loop supply line by way of primary coolant loop bypass line.

7. The modular scalable coolant distribution unit (CDU) of claim 1; wherein said automatic fill system is connected to said expansion tank.

8. The modular scalable coolant distribution unit (CDU) of claim 1; wherein said at least one coolant temperature sensor for said secondary coolant supply line is opposite heat exchanger side of said at least one pump.

9. The modular scalable coolant distribution unit (CDU) of claim 1 further comprising:
an interface with at least one free-cooling source wherein said interface comprises at least one free-cooling sensor measuring said at least one free-cooling cooling source;
free-cooling control software monitoring said free-cooling source and cooling environment;
at least one free-cooling control valve capable of directing cooling among a plurality of CDUs; and
at least one rear door liquid heat exchanger.

10. The modular scalable coolant distribution unit (CDU) of claim 1; wherein a floor-mount CDU supports up to about approximately 12 rear door equipment heat exchangers (RDHxs).

11. The modular scalable coolant distribution unit (CDU) of claim 1; wherein said CDU is a rack-mounted CDU;
said rack-mounted CDU occupying 6 U height in a 19 inch EIA COMPLIANT enclosure, supporting up to two rear door equipment heat exchangers (RDHxs), providing up to 20 kW cooling capacity.

12. The modular scalable coolant distribution unit (CDU) of claim 1; wherein up to six rack-mounted CDUs are joined together in series, thereby supporting up to twelve RDHxs.

13. The modular scalable coolant distribution unit (CDU) of claim 1 further comprising:
redundant variable speed pumps, actuators, and control valves.

14. The modular scalable coolant distribution unit (CDU) of claim 1; wherein said at least one valve in said primary coolant loop return line modulates heat rejected to said primary coolant loop whereby water in said secondary loop is maintained in a non-condensing condition about approximately two degrees centigrade above dew point of said facility, whereby all cooling is sensible, even as temperature and humidity vary.

15. A modular scalable coolant distribution unit (CDU) cooling method comprising:
providing a CDU comprising a primary coolant loop comprising connect coupling for fluid communication with at least one cooling source; a secondary coolant loop comprising connect coupling for fluid communication with at least one equipment heat exchanger; an expansion tank in said secondary coolant loop; a heat exchanger in fluid communication with said primary coolant loop and in fluid communication with said secondary coolant loop wherein heat is exchanged between said primary coolant loop and said secondary coolant loop; at least one valve in said primary coolant loop return line; at least one pump in supply line of said secondary coolant loop; a first secondary coolant loop valve in said supply line of said secondary coolant loop between said at least one pump and an expansion tank; an automatic fill system in fluid communication with said supply line of said secondary coolant loop; at least one coolant temperature sensor for said secondary coolant supply line; at least one dew point sensor monitoring dew point of facility housing said at least one equipment heat exchanger; a second secondary coolant loop valve in said secondary supply line between said pump and said at least one equipment heat exchanger; a controller in communication with at least said at least one valve in said primary coolant loop return line, said at least one pump, said at least one dew point sensor, and said at least one coolant temperature sensor, wherein multiple characteristics of said at least one valve in said primary coolant loop, said at least one pump, and said at least one coolant temperature sensor are configured to balance heat transfer between said at least one cooling source and said at least one equipment heat exchanger; and
delivering, wherein when in operation, conditioned coolant to said at least one equipment heat exchanger from said at least one cooling source.

16. The modular scalable coolant distribution unit (CDU) cooling method of claim 15; wherein said operation of floor-mounted CDU consumes about approximately 2,500 watts maximum electrical power, thereby operating cooling for up to 150 kW of heat generated by up to 12 equipment racks at less than 250 watts electrical power per equipment rack comprising a passive rear door heat exchanger.

17. The modular scalable coolant distribution unit (CDU) cooling method of claim 15 comprising the further steps of:
supplying make up water supplied by dual automatic fill pumps to supply to said secondary loop; and
filling with treated water by pumps drawing treated water from an on-board reservoir in said CDU exclusive of an external water source.

18. The modular scalable coolant distribution unit (CDU) cooling method of claim 15 further comprising:
filtering by a water filtration system for said secondary and primary loops whereby flushing is performed without interrupting unit operation.

19. The modular scalable coolant distribution unit (CDU) cooling method of claim 15 further comprising the steps of:
measuring flow of chilled water through the primary loop with a flow meter; and
regulating flow to each of a plurality of equipment heat exchangers by secondary distribution flow regulators.

20. A modular scalable coolant distribution unit (CDU) system comprising:
- a primary coolant loop comprising connect coupling for fluid communication with at least one cooling source;
- a secondary coolant loop comprising connect coupling for fluid communication with at least one passive rear door equipment heat exchanger;
- an expansion tank in said secondary coolant loop;
- a stainless steel brazed plate heat exchanger, external to said expansion tank, in fluid communication with said primary coolant loop and in fluid communication with said secondary coolant loop wherein heat is exchanged between said primary coolant loop and said secondary coolant loop;
- at least one valve in said primary coolant loop return line, wherein said at least one valve in said primary coolant loop return line comprises a three-way valve in said primary coolant loop between primary coolant loop return line, said heat exchanger and primary coolant loop supply line by way of primary coolant loop bypass line;
- at least one pump in supply line of said secondary coolant loop;
- wherein said at lest one secondary coolant loop pump is magnetically driven and fill pumps are self-priming;
- a first secondary coolant loop valve in said supply line of said secondary coolant loop between said pump and said expansion tank;
- an automatic fill system in fluid communication with said supply line of said secondary coolant loop connected to said expansion tank;
- at least one coolant temperature sensor for said secondary coolant supply line opposite heat exchanger side of said pump;
- at least one dew point sensor monitoring dew point of facility housing said at least one equipment heat exchanger;
- a second secondary coolant loop valve in said secondary supply line between said pump and said at least one equipment heat exchanger;
- a controller in communication with at least said at least one valve in said primary coolant loop return line, said at least one pump, said at least one dew point sensor, and said at least one coolant temperature sensor, wherein multiple characteristics of said at least one valve in said primary coolant loop, said at least one pump, and said at least one coolant temperature sensor is configured to balance heat transfer between said at least one cooling source and said at least one equipment heat exchanger;
- wherein said CDU system is capable of controlling secondary supply water temperature based on user selectable methods, fixed set point, fixed set point with dew point override or dew point tracking with adjustable offset;
- wherein said modular scalable CDU supports incremental capacity increase and component redundancy, providing an interface for at least one free-cooling source; and
- wherein when in operation, said CDU delivers conditioned coolant to said at least one heat exchanger from said at least one cooling source, thereby reducing heat load on at least one air conditioning unit.

* * * * *